United States Patent [19]
Pamler et al.

[11] Patent Number: 5,626,279
[45] Date of Patent: May 6, 1997

[54] METHOD FOR FASTENING A FIRST SUBSTRATE ON A SECOND SUBSTRATE AND EMPLOYMENT OF SAID METHOD FOR MANUFACTURING A THREE-DIMENSIONAL CIRCUIT ARRANGEMENT

[75] Inventors: Werner Pamler, Munich; Siegfried Schwarzl, Neubiberg, both of Germany

[73] Assignee: Siemens Aktiengesellschaft, Munich, Germany

[21] Appl. No.: 555,855

[22] Filed: Nov. 13, 1995

[30] Foreign Application Priority Data

Nov. 17, 1994 [DE] Germany ............... 44 40 982.6

[51] Int. Cl.⁶ ...................................................... H05K 3/34
[52] U.S. Cl. ........................ 228/123.1; 228/206; 228/209
[58] Field of Search ........................ 228/123.1, 198, 228/206, 208, 209, 234.1

[56] References Cited

U.S. PATENT DOCUMENTS

| | | | |
|---|---|---|---|
| 4,753,683 | 6/1988 | Ellion et al. | 136/244 |
| 4,818,728 | 4/1989 | Rai et al. | 437/209 |
| 5,081,062 | 1/1992 | Vasudev et al. | 437/132 |
| 5,087,585 | 2/1992 | Hayashi | 437/51 |
| 5,381,024 | 1/1995 | Valster | 257/97 |
| 5,419,806 | 5/1995 | Huebner | 156/645.1 |

FOREIGN PATENT DOCUMENTS

| | | |
|---|---|---|
| 2902002 | 7/1988 | Germany . |
| 4903790A1 | 8/1994 | Germany . |

OTHER PUBLICATIONS

Yasumoto, et al., "Promising New Fabrication Process Developed for Stacked LSI's", IEDM, pp. 816–819, 1984.
Frass, et al., "Epitaxial Growth from Organometallic Sources in High Vacuum", J. Vac. Sci. Technol. B4(1), pp. 22–29, Jan./Feb. 1986.
Tsubouchi, et al., "Area-Selective CVD of Metals", Thin Solid Films, Bd., 228, pp. 312–318, 1993.

*Primary Examiner*—Samuel M. Heinrich
*Attorney, Agent, or Firm*—Hill, Steadman & Simpson

[57] ABSTRACT

For fastening a first substrate (11) on a second substrate (21), gallium is selectively deposited on the surface of electrically conductive structures (18) located on the first substrate (11), being deposited in a CVD process upon employment of a metalloorganic compound. After the joining of the substrates (11, 21), the gallium (19) is mixed with a metal (28) that forms a refractory intermetallic phase with gallium, this forming a firm connection between the substrates. The method can be especially utilized for cubic integration.

20 Claims, 1 Drawing Sheet

METHOD FOR FASTENING A FIRST SUBSTRATE ON A SECOND SUBSTRATE AND EMPLOYMENT OF SAID METHOD FOR MANUFACTURING A THREE-DIMENSIONAL CIRCUIT ARRANGEMENT

BACKGROUND OF THE INVENTION

The present invention generally relates to methods for electrically and mechanically connecting substrates. More particularly, it relates to a method for connecting and joining substrates employing a gallium intermetallic phase.

Substrates must be firmly connected to one another in various technical applications. For example, discrete semiconductor chips must thus be secured on carriers or heat sinks in chip mounting.

A further application arises in cubic integration. Substrates that contain integrated circuits, sensor structures or the like and that can be composed of different substrate materials and/or can be fabricated in different technologies are thereby ground thin to a few 10 µm and are arranged as stacks. Contacts via which the circuit structures in the various substrates are connected to one another are formed in vertical direction. Such a component stack looks like a new semiconductor module when viewed from the outside. The neighboring substrates in the stack must be firmly connected to one another. Connections between contacts that meet one another from neighboring substrates must thereby also be formed.

European patent application EP 0 610 709 A has proposed that a refractory intermetallic phase be employed for connecting and through-contacting of substrates. This intermetallic phase is formed of a mixture of two metal constituents, the one thereof being liquid at the processing temperature and the other being solid and the solid constituent thereof dissolving in the liquid constituent, this leading to the hardening of the mixture. The mixture has completely solidified when the solidus curve in the phase diagram is upwardly transgressed. In German usage, such an intermetallic phase is referred to as amalgam insofar as the liquid constituent is composed of mercury. In the proposed method, however, the liquid constituent is not limited to mercury. In particular, it can be mercury, gallium or indium. The mixture is introduced into depressions that are respectively produced in neighboring substrates and that meet one another when the substrates are joined. The depressions are cast out with the liquid constituent. Excess material is removed by shaking or in an alternating electromagnetic field.

SUMMARY OF THE INVENTION

The present invention is based on the problem of specifying a further method for fastening a first substrate on a second substrate upon employment of a refractory intermetallic phase that, in particular, is suitable for the manufacture of a three-dimensional circuit arrangement.

This problem is inventively solved by a method according to claim 1. Further developments of the invention proceed from the other claims.

In the inventive method, gallium is employed as the metal constituent that is liquid at the processing temperature. Gallium has a melting point of 29.8° C. In the inventive method, the gallium is applied onto electrically conductive structures by selective deposition, these electrically conductive structures being surrounded by insulating structures of dielectric material. The electrically conductive structures can thereby be composed of metal, metal silicide or of doped silicon. The deposition of the gallium ensues from the vapor phase upon employment of a metalloorganic compound. Trialkylgallium having the chemical formula Ga $(C_n H_{2n+1})_3$, whereby n is a whole number greater than 0, is thereby particularly employed as metalloorganic compound. Trialkylgallium, particularly trimethylgallium as well as triethylgallium, are initial materials for the manufacture of III-V semiconductor layers in CVD processes (see L. M. Fraas et al., *J. Vac. Sci. Technol.*, B4(1), 1986, pp. 22–29). The invention utilizes the observation that GaAs does not deposit on insulator layers with these initial materials.

Dimethylgallium hydride together with hydrogen can also be employed as metalloorganic compound. The hydrogen thereby deposits at the first principal surface. A reaction of the $CH_3$ group and dissociated hydrogen to form $CH_4$, which is volatile, occurs at the surface of the electrically conductive structures upon catalytic action of free electrons from the electrically conductive structure. Since these free electrons are not available at the surface of insulating structures of dielectric material, the gallium deposits selectively on the surface of the electrically conductive structures. The hydrogen can be added as a process gas or can be applied on the first principal surface as a surface coat as a result of a surface treatment with aqueous hydrofluoric acid ($HF:H_2O$) and distilled water before the deposition. As soon as the surface of the electrically conductive structures is covered with a first layer of gallium atoms, hydrogen being released in the deposition reaction deposits at the surface thereof, so that the reaction continues to proceed. A similar model for the selective deposition of aluminum was proposed by T. Tsubouchi et al., *Thin Solid Films*, Vol. 228 (1993), pp. 312–318.

Nickel or copper is preferably employed as metal that is mixed with the gallium upon formation of an intermetallic phase. An intermetallic phase with gallium and 35 weight percent nickel has a melting point of 895° C. An intermetallic phase of gallium and copper with 55 weight percent copper has a melting point of 485° C.

The electrically conductive structure on which the gallium is deposited preferably contains the metal that is required for the formation of the intermetallic phase. The conductive structure can thereby be composed of a different metal and the metal for the intermetallic phase.

It lies within the scope of the invention to generate metal structures on the second principal surface of the second substrate that faces toward the first principal surface of the first substrate when the substrates are joined, these metal structures being generated of the metal that is employed for the formation of the intermetallic phase. In this case, the electrically conductive structures onto which the gallium is deposited are preferably formed of a metal that does not form an intermetallic phase with gallium, for example tungsten or aluminum, which also represents the standard metallization in microelectronics. This embodiment has the advantage that a premature reaction between gallium and the metal to form the intermetallic phase is suppressed. It is assured in this embodiment that the reaction for the formation of the intermetallic phase does not begin until the two substrates have been joined.

Alternatively, the conductive structures can also be coated with a thin nickel or copper layer. The layer thickness is thereby dimensioned such that only a part of the applied gallium is consumed in the reaction occurring here. An especially good mechanical adhesion of the two substrates is achieved in this way.

The method is suitable for fastening detached components to heat sinks or carriers.

The method can be especially advantageously utilized for manufacturing a three-dimensional circuit arrangement. To that end, a plurality of substrates that comprise circuit structures in the region of their upper side and that are thinned proceeding from their backside, for example to a few 10 μm, are joined as a stack and firmly connected to one another. To that end, firm connection of the intermetallic phase are formed between neighboring substrates, this intermetallic phase being formed in the mixing of gallium and metal. To that end, the gallium is respectively selectively deposited on an electrically conductive structure on one of the substrates. The metal required for mixing can likewise be contained in the electrically conductive structure or can be applied on the other substrate as a metal structure. Electrically conductive structures can be contacts that adjoin the principal surface in the respective substrate or can be surfaces additionally applied outside the contacts and insulated from the contacts.

The second substrate to be joined is preferably provided with a corresponding arrangement of contacts and metal surfaces. Dielectric material, for example $SiO_2$, of a planarization layer is respectively present between the electrically conductive structures. Contacts that meet one another in circuit structures manufactured in this way are electrically and mechanically connected to one another. Additional metal surfaces that meet one another serve the purpose of mechanical connection as well as the purpose of a heat elimination from the three-dimensional circuit arrangement. An insulation between contacts and metal surfaces is assured by the insulating structure of dielectric material arranged therebetween and by the selective gallium deposition on the surface of the electrically conductive structures.

The invention shall be set forth in greater detail below with reference to an exemplary embodiment and to the FIGS.

DETAILED DESCRIPTION OF THE PREFERRED EMBODIMENTS

Figure 1:
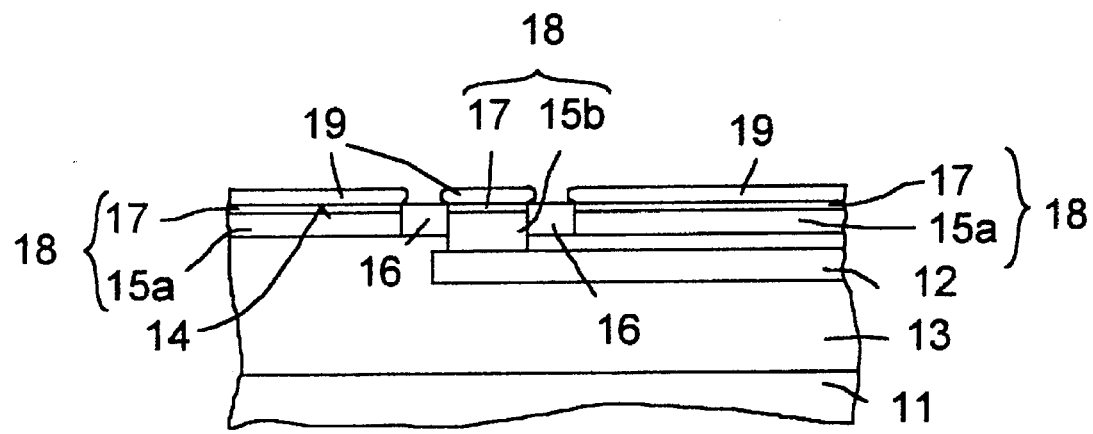
FIG. 1 shows a first substrate that comprises electrically conductive structures and insulating structures of dielectric material in the region of a first principal surface, being shown after the selective deposition of gallium onto the surface of the electrically conductive structures.

A first substrate 11 that, for example, is a semiconductor wafer of single-crystal silicon or a III-V semiconductor or a detached chip from such a semiconductor wafer comprises circuit structures that are component parts of a microelectronic circuit or of an optoelectronic component (see FIG. 1). The circuit structures, which are not shown in detail in FIG. 1, comprise at least one metallization level 12 that is insulated from the substrate 11 by a SiO2 layer 13. The substrate 11 comprises electrically conductive structures 15 as well as insulating structures 16 in the region of a first principal surface 14.

The electrically conductive structures 15 comprise metal surfaces 15a that are arranged on the surface of the SiO2 layer 13 and contacts 15b that extend onto the surface of the metallization level 12. The metal surfaces 15a and the contacts 15b are formed of a metal, for example aluminum or tungsten. A respective conductive layer 17 is arranged on the surfaces of the metal surfaces 15a as well as of the contacts 15b on the surface of the metal surfaces 15a [sic]. The conductive layer 17 comprises a thickness of, for example, 100 nm and is formed of nickel or copper. The metal surfaces 15a and the conductive layer 17 arranged thereon as well as the contacts 15b with the conductive layer 17 arranged thereon form electrically conductive structures 18 in common. The electrically conductive structures 18 can also be completely formed of one material. One of the insulating structures 16 is arranged between two respective electrically conductive structures 18. The insulating structures 16 are composed, for example, of SiO2, $Si_3N_4$ or the like.

Gallium 19 is deposited onto the surface of the electrically conductive structures 18 by deposition from the vapor phase (CVD). The gallium 19 is deposited, for example, in a thickness of 0.5 μm.

The deposition is implemented, for example, upon employment of a process gas containing trimethylgallium in the pressure range from 1–5 Torr (1.33–6.65 hPa) with a partial pressure of the trimethylgallium of approximately 1–10 mTorr (0.13–1.3 Pa) and in the temperature range from 350°–500° C.

Alternatively, a process gas containing triethylgallium can be employed for the deposition of the gallium 19 in the CVD process and the deposition can be implemented in the pressure range from 1–5 Torr (1.33–6.65 hPa) with a partial pressure of triethylgallium from 1–10 Mtorr (0.13–1.3 Pa) and in the temperature range from 350°–500° C.

Finally, the gallium 19 can be deposited upon employment of dimethylgallium hydride $Ga(CH_3)_2H$ and $H_2$. To that end, the first principal surface 14 is cleaned with aqueous hydrofluoric acid before the CVD deposition. The ratio of $HF:H_2O$ thereby amounts to 1:50–1:100. Subsequently, the first principal surface 14 is rinsed for about 10 minutes in distilled water. As a result of this pretreatment, a $H_2$ occupation forms at the first principal surface 14. The first principal surface 14 is heated to a temperature in the range from 200°–350° C. for the deposition. The hydrogen $H_2$ dissociates at the heated surface of the electrically conductive structures 18 upon catalytic cooperation of free electrons that are available in the electrically conductive structures 18, dissociating to form atomic hydrogen H. The deposition ensues via the reaction:

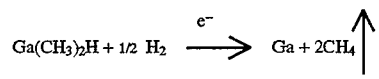

The deposition ensues in the pressure range from 1–5 Torr (1.33–6.65 hPa), whereby the partial pressure of dimethylgallium hydride amounts to 1–10 mTorr (0.13–1.3 Pa). The temperature range for the deposition lies between 200° and 350° C.

Figure 2:
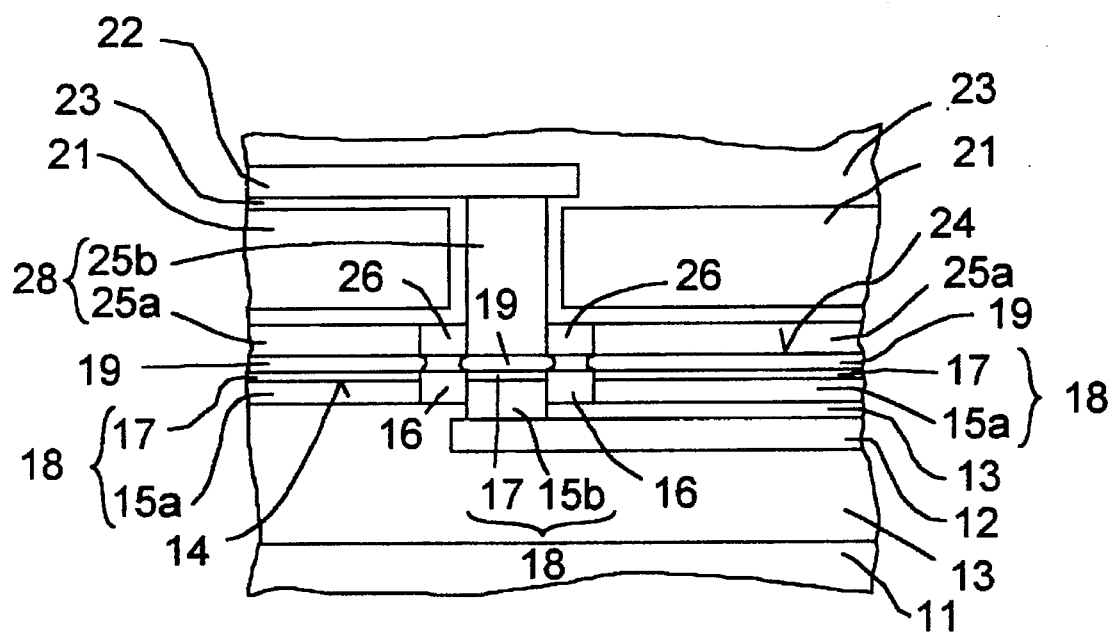
FIG. 2 shows the first substrate after the joining to a second substrate and formation of an intermetallic phase for a firm connection between the two substrates.

Subsequently, the first substrate 11 is joined to a second substrate 21. The second substrate 21 that, for example, is a semiconductor wafer of single-crystal silicon or a III-V semiconductor or a detached semiconductor chip from such a semiconductor wafer comprises circuit structures that are the component parts of a microelectronic circuit or of an optoelectronic component or of a sensor component. The circuit structures that are not shown in detail in FIG. 2 comprise at least one metallization level 22 that is insulated from the second substrate 21 by a $SiO_2$ layer 23.

In the region of a second principal surface 24, the second substrate 21 comprises metal structures 28 and insulating structures 26. Metal surfaces 25a that are arranged at the surface of the SiO₂ layer 23 and contacts 25b that extend via a hole onto the metallization level 22 are included among the electrically conductive structures 28. The metal surfaces 25a and the contacts 25b are formed, for example, of nickel. The layer thickness amounts to approximately 1–1.5 μm and is dimensioned such that all of the gallium is consumed in the formation of the refractory intermetallic phase.

The first substrate 11 and the second substrate 21 are joined such that corresponding metal surfaces 15a and 25a as well as the corresponding contacts 15b and 25b meet one another.

The substrates are pressed together in a vacuum (pressure<1 mbar) at a temperature in the range from 200°–300° C. and with a pressure of approximately 1000 Pa. The gallium 19 situated on the surface of the conductive structures 18 of the first substrate 11 thereby melts and joins with the metal structures 28 that are located in the region of the second principal surface 24 of the second substrate 21. An intermetallic phase that has a melting point of 895° C. arises in the mixing of gallium 19 and nickel of the metal structures 28. This melting point lies far above the processing temperature of a maximum of 450° C., so that the intermetallic phase solidifies and leads to a firm connection between the two substrates.

Since the gallium 19 is selectively deposited on the surface of the electrically conductive structures 18 and since the metal structures 28 meet the electrically conductive structures 18, a short between neighboring metal surfaces 15a, 25a and contacts 15b, 25b is effectively avoided. Over and above this, a high uniformity of the layer thickness of the gallium 19 is achieved by the selective deposition of the gallium 19. A uniformity of the layer thickness of ±5 percent is achieved in the deposition of the gallium 19.

Alternatively to nickel, the metal structures 28 can also be formed of copper.

What is claimed is:

1. A method for electrically connecting and mechanically securing a first substrate to a second substrate, said method comprising the steps of:

providing a first substrate including at least one surface having electrically conductive structures and insulating structures defined thereon;

selectively depositing a gallium layer onto surfaces of the electrically conductive structures by vapor phase deposition using a metalloorganic compound;

providing a second substrate including at least one surface having electrically conductive structures and insulating structures defined thereon;

moving the first and the second substrates relative to each other so that at least portions of their respective electrically conductive structures are disposed in abutting face to face relationship to provide an assembly; and thereafter, subjecting the assembly to conditions sufficient to cause the gallium layer to melt and to form an intermetallic phase with the electrically conductive regions on the first and second substrates to electrically connect and mechanically secure the first and second substrates together.

2. A method as defined in claim 1, wherein said first substrate is selected from the group consisting of: semiconductor wafers, III-V semiconductors, microelectronic circuit components and optoelectronic components.

3. A method as defined in claim 1, wherein the electrically conductive structures on said first substrate are composed of a metal, a metal silicide or a doped silicon.

4. A method as defined in claim 1, wherein the electrically conductive structures on said first substrate comprise aluminum or tungsten.

5. A method as defined in claim 4, wherein said electrically conductive structures further include a thin coating layer of nickel or copper defined on a surface thereof.

6. A method as defined in claim 1, wherein in said depositing step the metalloorganic compound comprises a trialkylgallium compound.

7. A method as defined in claim 6, wherein said trialkylgallium compound is selected from trimethylgallium and triethylgallium.

8. A method as defined in claim 1, wherein in said subjecting step, the assembly is heated to a temperature of from about 200° to about 300° C. in a vacuum of less than about 1 mbar and the substrates are pressed together at a pressure of about 1000 Pa.

9. A method as defined in claim 1, wherein said second substrate is selected from the group consisting of semiconductor wafers, microelectronic circuit components, optoelectronic components and sensor components.

10. A method as defined in claim 1, wherein the electrically conductive structures on said second substrate comprise nickel or copper.

11. A method as defined in claim 1, further comprising the steps of:

cleaning the electrically conductive structures on said first substrate with dilute aqueous hydrofluoric acid and rinsing with distilled water to provide H₂ occupation on surfaces of said electrically conductive structures, prior to said deposition step.

12. A method as defined in claim 11, wherein in said deposition step the metalloorganic compound comprises dialkylgallium hydride.

13. A method as defined in claim 12, wherein said dialkylgallium hydride is dimethylgallium hydride.

14. A method as defined in claim 1, wherein in said deposition step, dimethylgallium hydride is used as the metalloorganic compound together with a process gas comprising H₂.

15. A method as defined in claim 1, wherein said insulating structures on said first and second substrates comprise SiO₂ or Si₃N₄.

16. A method as defined in claim 1, wherein a plurality of first substrates and a plurality of second substrates are provided including more than one surface having electrically conductive structures and insulating structures and the first and second substrates are alternately stacked together to form said assembly prior to said subjecting step.

17. A method as defined in claim 1, wherein said first and second substrates each additionally comprise metal regions defined thereon insulated from their respective electrically conductive structures which provide additional mechanical securement in said assembly after said deposition and subjecting steps.

18. A method as defined in claim 7, wherein in said deposition step a process gas containing the trialkylgallium compound in a pressure range of from about 1 to about 5 Torr, with a partial pressure of the trialkylgallium compound of from about 1 to about 10 mTorr is used at a deposition temperature of from about 350° to about 500° C.

19. A method as defined in claim 13, wherein in said deposition step, a process gas containing dimethylgallium hydride in a pressure range of from about 1–5 Torr, with a partial pressure of dimethylgallium hydride of from about 1 to about 10 mTorr is used at a deposition temperature of from about 200° to about 350° C.

20. A method as defined in claim 1, wherein said gallium layer has a thickness of about 0.5 μm.

* * * * *